US006953957B2

(12) United States Patent
McCulloch et al.

(10) Patent No.: US 6,953,957 B2
(45) Date of Patent: Oct. 11, 2005

(54) CHARGE TRANSPORT MATERIAL INCLUDING A POLY-3,3"-DIALKYL-2,2':5'2"-TERTHIOPHENE

(75) Inventors: Iain McCulloch, Southampton (GB); Marcus Thompson, Hamshire (GB); Mark Giles, Southampton (GB); Martin Heeney, Southampton (GB); Steven Tierney, Southampton (GB); Henning Rost, Erlangen (DE)

(73) Assignees: Merck Patent GmbH, Darmstadt (DE); Siemens AG, Munich (DE)

( * ) Notice: Subject to any disclaimer, the term of this patent is extended or adjusted under 35 U.S.C. 154(b) by 126 days.

(21) Appl. No.: 10/684,584

(22) Filed: Oct. 15, 2003

(65) Prior Publication Data
US 2005/0161708 A1    Jul. 28, 2005

(30) Foreign Application Priority Data
Oct. 15, 2002 (EP) .................................. 02023109

(51) Int. Cl.$^7$ ............................................ H01L 27/148
(52) U.S. Cl. .......................... 257/215; 430/59; 430/70; 430/71; 430/72; 430/73; 430/76; 430/77
(58) Field of Search ............................. 430/59, 70, 71, 430/72, 73, 76, 77

(56) References Cited

U.S. PATENT DOCUMENTS 4,861,692 A * 8/1989 Kuroda et al. ........... 430/58.15

* cited by examiner

Primary Examiner—David Nelms
Assistant Examiner—Mai-Huong Tran
(74) Attorney, Agent, or Firm—Millen White Zelano & Branigan, P.C.

(57) ABSTRACT

The invention generally relates to the use of poly-3,3"-dialkyl-2,2':5',2"-terthiophenes as charge transport materials or semiconductors in electrooptical, electronic or electroluminescent devices, and to charge transport and semiconducting components and devices comprising poly-3,3"-dialkyl-2,2':5',2"-terthiophenes.

18 Claims, 2 Drawing Sheets

CHARGE TRANSPORT MATERIAL INCLUDING A POLY-3,3''-DIALKYL-2,2':5'2''-TERTHIOPHENE

The invention relates to the use of poly-3,3''-dialkyl-2,2': 5',2''-terthiophenes as charge transport materials or semiconductors in electrooptical, electronic and electroluminescent devices. The invention further relates to charge transport and semiconducting components and devices comprising poly-3,3''-dialkyl-2,2':5',2''-terthiophenes.

Organic materials have recently shown promise as the active layer in organic based thin film transistors and organic field effect transistors [see H. E. Katz et al., *Acc. Chem. Res.*, 2001, 34, 5, 359]. Such devices have potential applications in smart cards, security tags and the switching element in flat panel displays. Organic materials are envisaged to have substantial cost advantages over their silicon analogues if they can be deposited from solution, as this enables a fast, large-area fabrication route.

The performance of the device is principally based upon the charge carrier mobility of the semiconducting material and the current on/off ratio, so the ideal semiconductor should have a low conductivity in the off state, combined with a high charge carrier mobility ($>1\times10^{-3}$ cm$^2$V$^{-1}$s$^{-1}$). In addition, it is important that the semiconducting material is relatively stable to oxidation, i.e., it has a high ionization potential, as oxidation leads to reduced device performance.

A known compound which has been shown to be an effective p-type semiconductor for OFETs is pentacene [see S. F. Nelson et al., *Appl. Phys. Lett.*, 1998, 72, 1854]. When deposited as a thin film by vacuum deposition, it was shown to have carrier mobilities in excess of 1 cm$^2$ V$^{-1}$s$^{-1}$ with very high current on/off ratios greater than 10$^6$. However, vacuum deposition is an expensive processing technique that is unsuitable for the fabrication of large-area films.

Regioregular head-to-tail poly(3-hexylthiophene) has been reported with charge carrier mobility between 1×10$^{-5}$ and 4.5×10$^{-2}$ cm$^2$ V$^{-1}$s$^{-1}$, but with a rather low current on/off ratio between 10 and 10$^3$ [see Z. Bao et al., *Appl. Pys. Lett.*, 1996, 69, 4108]. This low on/off current is due in part to the low ionization potential of the polymer, which can lead to oxygen doping of the polymer under ambient conditions, and a subsequent high off current [see H. Sirringhaus et al., *Adv. Solid State Phys.*, 1999, 39, 101]. A high regioregularity leads to improved packing and optimized microstructure, leading to improved charge carrier mobility [see H. Sirringhaus et al., *Science*, 1998, 280, 1741–1744; H. Sirringhaus et al., *Nature*, 1999, 401, 685–688; and H. Sirringhaus, et al., *Synthetic Metals*, 2000, 111–112, 129–132].

In general, poly(3-alkylthiophenes) show improved solubility and are solution processable to fabricate large area films. However, poly(3-alkylthiophenes) have relatively low ionization potentials and are susceptible to doping in air.

It is an aim of the present invention to provide improved materials for use as semiconductors or charge transport materials, which are easy to synthesize, have high charge mobility, good processibility and oxidative stability.

Another aim of the invention is to provide new semiconductor and charge transport components, and new and improved electrooptical, electronic and electroluminescent devices comprising these components, like field effect transistors (FET) as components of integrated circuitry or of thin film transistors (TFT), and organic light emitting diode (OLED) applications like electroluminescent displays or backlights of liquid crystal displays.

Other aims of the invention are immediately evident to those skilled in the art from the following description.

These aims can be achieved by using poly-3,3''-dialkyl-2,2':5',2''-terthiophenes as semiconductors and charge transport materials.

The synthesis of poly-3,3''-dialkyl-2,2':5',2''-terthiophenes (1), wherein $R_1$ and $R_2$ are alkyl groups, via ferric chloride oxidative coupling has been described in WO 94/02530 and M. C. Gallazi, C. Bertarelli, E. Montoneri, *Synthetic Metals*, 2002, 128, 91.

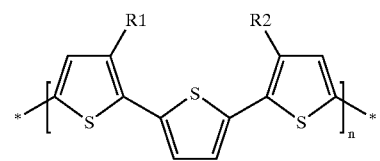

WO 94/02530, EP-A-0 945 723 and WO 99/31494 report the application of poly-3,3''-dialkyl-2,2':5',2''-terthiophenes (1) in their doped conductive form as electro-conductive layers in gas sensors. Furthermore, JP-A-63-002251 discloses conductive poly-3,3''-dialkyl-2,2':5',2''-terthiophenes (1) prepared via electrolytic polymerization for use as polymeric cathodes in secondary batteries. However, there have been no reports of the application of poly-3,3''-dialkyl-2,2': 5',2''-terthiophenes (1) as semiconductors or charge transport materials.

The present invention relates to the use of 3,3''-disubstituted poly-2,2':5',2'-terthiophenes of formula I

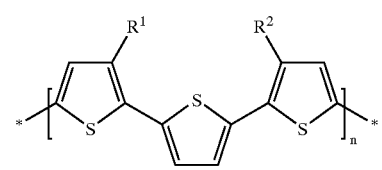

wherein R$^1$ and R$^2$ are independently of each other straight chain or branched alkyl, alkoxy, alkenyl, alkylcarbonyl, alkoxycarbonyl alkylcarbonyloxy, alkylthio, alkylthioalkyl, alkoxyalkyl, alkylsulfinyl or alkylsulfonyl with 1 to 20 C-atoms, or alkylaryl or arylalkyl comprising an alkyl group with 1 to 20 C atoms, and n is an integer >1, as semiconductors or charge transport materials.

The invention further relates to the use of polymers of formula I as semiconductors or charge transport materials in optical, electrooptical or electronic devices, including field effect transistors (FET) for example as components of integrated circuitry, of thin film transistors (TFT) for flat panel display applications, or of radio frequency identification (RFID) tags, and semiconducting components for organic light emitting diode (OLED) applications including both the charge transport and electroluminescent layers in electroluminescent displays or backlights of liquid crystal displays.

The invention further relates to a semiconducting or charge transport component or device comprising a polymer of formula I as semiconducting or charge transport material.

The invention further relates to an optical, electrooptical or electronic device, FET, integrated circuit (IC), TFT or OLED comprising a semiconducting or charge transport component or device according to the invention.

The invention further relates to a TFT or TFT array for flat panel displays, radio frequency identification (RFID) tag, electroluminescent display or backlight comprising a semiconducting or charge transport component or device or a FET, IC, TFT or OLED according to the invention.

The invention further relates to a security marking or device comprising a FET or an RFID tag according to the invention.

Figure 1A:
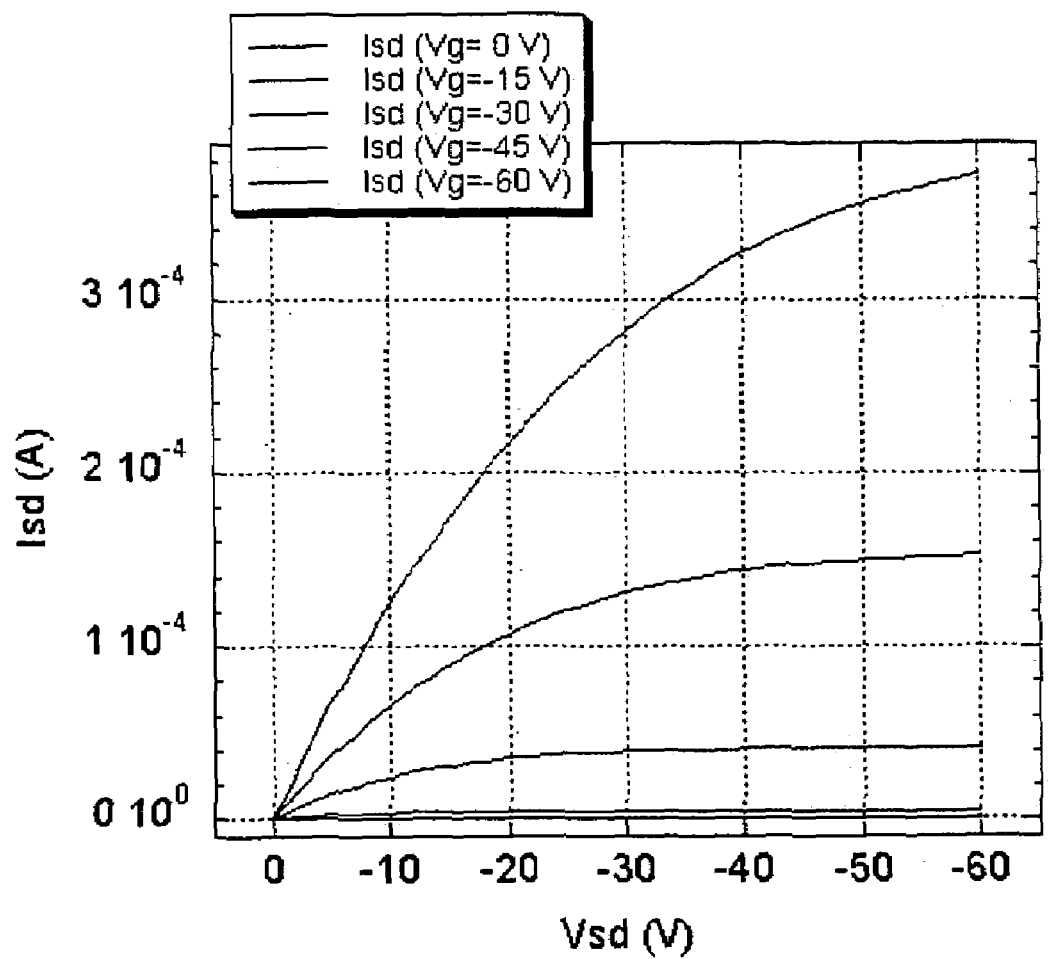
FIG. 1a is a graphical depiction of a source-drain voltage, varying between 0 and −60 volts.

The semiconductors and charge transport materials and components according to the present invention comprise polymers of formula I, which exhibit both a high degree of planarity in the backbone and strong interchain $\pi-\pi$, stacking interactions, making them effective charge transport materials with high carrier mobilities. The alkyl substituents $R^1$ and $R^2$ in formula I are incorporated to solubilize the polymers and make them readily solution processable. Solution processing has the advantage over vacuum deposition processing of being a potentially cheaper and faster technique. Furthermore, the material is perfectly regioregular, which has been shown to improve packing density and optimize microstructure, leading to high carrier mobility. In fact, crystallization of poly-3,3''-dialkyl-2,2':5',2''-terthiophene was observed by differential scanning calorimetry (DSC) on cooling the polymer melt to 140° C. Therefore, the polymers of formula I are useful as semiconductors or charge transport materials in FETs e.g. as components of integrated circuitry, ID tags or TFT applications.

Especially preferred are polymers of formula I wherein n is an integer from 2 to 5000, in particular from 20 to 1000.

Further preferred are polymers of formula I with a molecular weight from 1000 to 100000.

Further preferred are polymers of formula I wherein $R^1$ and $R^2$ are straight chain alkyl with 1 to 12 C atoms.

The polymers of formula I can be synthesized according to or in analogy to known methods, for example as described in WO 94/02530 and M. C. Gallazi, C. Bertarelli, E. Montoneri, *Synthetic Metals*, 2002, 128, 91.

The polymers of formula I can also be synthesized via other known methods, namely Yamamoto coupling [T. Yamamoto, A. Morita, Y. Miyazaki, T. Maruyama, H. Wakayama, Z. H. Zhou, Y. Nakamura, T. Kanbara, S. Sasaki and K. Kubota, *Macromolecules*, 1992, 25, 1214.], the McCullough coupling (procedures 1 and 2) [R. D. McCullough et al., *J. Chem. Soc., Chem. Commun.*, 1992. 70; R. S. Loewe et al., *Macromolecules*, 2000, p. A-J; R. D. McCullough, U.S. Pat. No. 6,166,172], Rieke coupling [T.-A. Chen, R. D. Rieke, *J. Am. Chem. Soc.*, 1992, 114, 10087.], Suzuki coupling [N. Miyaura, T. Yanagi, A. Suzuki, *Synth. Commun.*, 1981, 11, 513.], and Stille coupling [D. Milstein, J. K. Stille, *J. Am. Chem. Soc.*, 1979, 101, 4992.], which is evident to those skilled in the art.

The polymers of formula I show advantageous solubility properties which allow production processes using solutions of these compounds. Thus films, including layers and coatings, may be generated by low cost production techniques, e.g., spin coating. Suitable solvents or solvent mixtures comprise alkanes and/or aromatics.

The polymers of formula I are useful as optical, electronic and semiconductor materials, in particular as charge transport materials in FETs, which can be used, for example, as components of ICs, ID tags or TFT applications. Generally, a semiconductor or charge transport layer includes 100% by weight of a polymer of the formula I. Alternatively, they may be used in OLEDs in electroluminescent display applications or as backlight of for example liquid crystal displays, and for other semiconductor applications.

The polymers of formula I are particularly useful as charge transport materials in FETs. Such FETs, where an organic semiconductive material is arranged as a film between a gate-dielectric and a drain and a source electrode, are generally known, e.g., from U.S. Pat. No. 5,892,244, WO 00/79617, U.S. Pat. No. 5,998,804. Generally, these FETs can be structured as follows: a source and a drain electrode are positioned on a semiconductor layer, in turn positioned on a gate-dielectric layer, in turn layered on a gate electrode and a substrate. Due to the advantages, like low cost production using the solubility properties of the compounds according to the invention and thus the processibility of large surfaces, preferred applications of these FETs are such as ICs, TFT-displays and security applications.

A typical fabrication method of a bottom-gate thin-film transistor (TFT) according to the present invention is described in the following, which should, however, be understood as an exemplary and preferred method, without limiting the scope of the present invention.

A solution of the polymer of formula I in xylene (10 mg/mL) is applied by solution coating, e.g., spin-coating, onto a prefabricated transistor substrate, such as a dielectric layer or a patterned substrate. Gold source-drain electrodes are defined by photolithography on a highly doped n+ silicon wafer with a ~210 nm silicon dioxide layer. Before polymer deposition, the hydrophilic silicon dioxide surface is chemically modified e.g. by hexamethyldisilazane (HMDS). Alternatively, a surface of a plastic, e.g., polyethylene terephthalate, can be modified.

Alternatively thin-film transistor (TFT) structures with a top-gate electrode [Sirringhaus et al., *Appl. Phys. Lett.*, 77, p 406–408.] can also be fabricated. For these type of devices, the semiconducting polymer layer typically is spin-coated onto a pre-patterned insulating substrate (glass, plastic etc) with source-drain electrodes. The insulating layer is coated on top, followed by a cross-linking process if necessary. The transistor is finished by depositing a top gate electrode by either some printing technique or a vacuum deposition process.

In security applications, FETs and other devices with semiconductive materials, like transistors or diodes, may be used for ID tags or security markings to authenticate and prevent counterfeiting of documents of value like banknotes, credit cards or ID cards, national ID documents, licenses or any product with money value, like stamps, tickets, shares, checks etc.

The polymers of formula I can also be used in OLEDs, e.g., in display applications or as backlight of e.g. liquid crystal displays. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The polymers of formula I may be employed in one or more of the charge transport layers and/or in the emission layer, corresponding to their electrical and/or optical properties. Furthermore their use within the emission layer is especially advantageous, if the polymers of formula I according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Meerholz, Synthetic Materials, 111–112, 2000, 31–34, Alcala, *J. Appl. Phys.*, 88, 2000, 7124–7128 and the literature cited therein.

According to another use, the polymers of formula I which show photoluminescent properties, may be employed as materials of light sources, e.g., of display devices such as described in EP 0 889 350 A1 or by C. Weder et al., *Science*, 279, 1998, 835–837.

A further aspect of the invention relates to both the oxidized and reduced form of the compounds and materials according to this invention. Either loss or gain of electrons results in formation of a highly delocalized ionic form, which is of high conductivity. This can occur on exposure to common dopants. Suitable dopants and methods of doping are known to those skilled in the art, e.g., from EP 0 528 662, U.S. Pat. No. 5,198,153 or WO 96/21659.

The doping process typically implies treatment of the semiconductor material with an oxidating or reducing agent in a redox reaction to form delocalized ionic centers in the material, with the corresponding counterions derived from the applied dopants. Suitable doping methods comprise, for example, exposing to a doping vapor in the atmospheric pressure or at a reduced pressure, electrochemical doping in a solution containing a dopant, bringing a dopant into contact with the semiconductor material to be thermally diffused, and ion-implanting of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)$ $(SbCl_6^-)$, $(NO_2^+)$ $(BF_4^-)$, $AgClO_4$, $H_2IrCl_6$, $La(NO_3)_3.6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds and materials of the present invention can be used as an organic "metal" in applications, for example, but not limited to, charge injection layers and ITO (indium tin oxide) planarizing layers in organic light emitting diode applications, films for flat panel displays and touch screens, antistatic films, printed conductive substrates, patterns or tracts in electronic applications such as printed circuit boards and condensers.

Without further elaboration, it is believed that one skilled in the art can, using the preceding description, utilize the present invention to its fullest extent. The preceding preferred specific embodiments are, therefore, to be construed as merely illustrative, and not limitative of the remainder of the disclosure in any way whatsoever.

In the foregoing and in the examples, all temperatures are set forth uncorrected in degrees Celsius and, all parts and percentages are by weight, unless otherwise indicated.

The entire disclosure of all applications, patents and publications, cited herein and of corresponding European application No. 02023109.8, filed Oct. 15, 2002, is incorporated by reference herein.

EXAMPLE 1

A bottom-gate TFT device is fabricated as described above using poly-3,3"-dialkyl-2,2':5',2"-terthiophene as the semiconducting layer. A charge carrier mobility ($\mu$) of 0.01 $cm^2$/Vs for holes and an on/off ratio ($I_{on}/I_{off}$) of $1 \times 10^6$ are measured for the device.

The transistor characteristics are measured with an Agilent 4155C semiconductor parameter analyzer under a dry nitrogen atmosphere. I–V curves (output and transfer characteristics) are recorded for a transistor structure with a channel length (L=10 $\mu$m) and a channel width (W=2 cm).

Figure 1B:
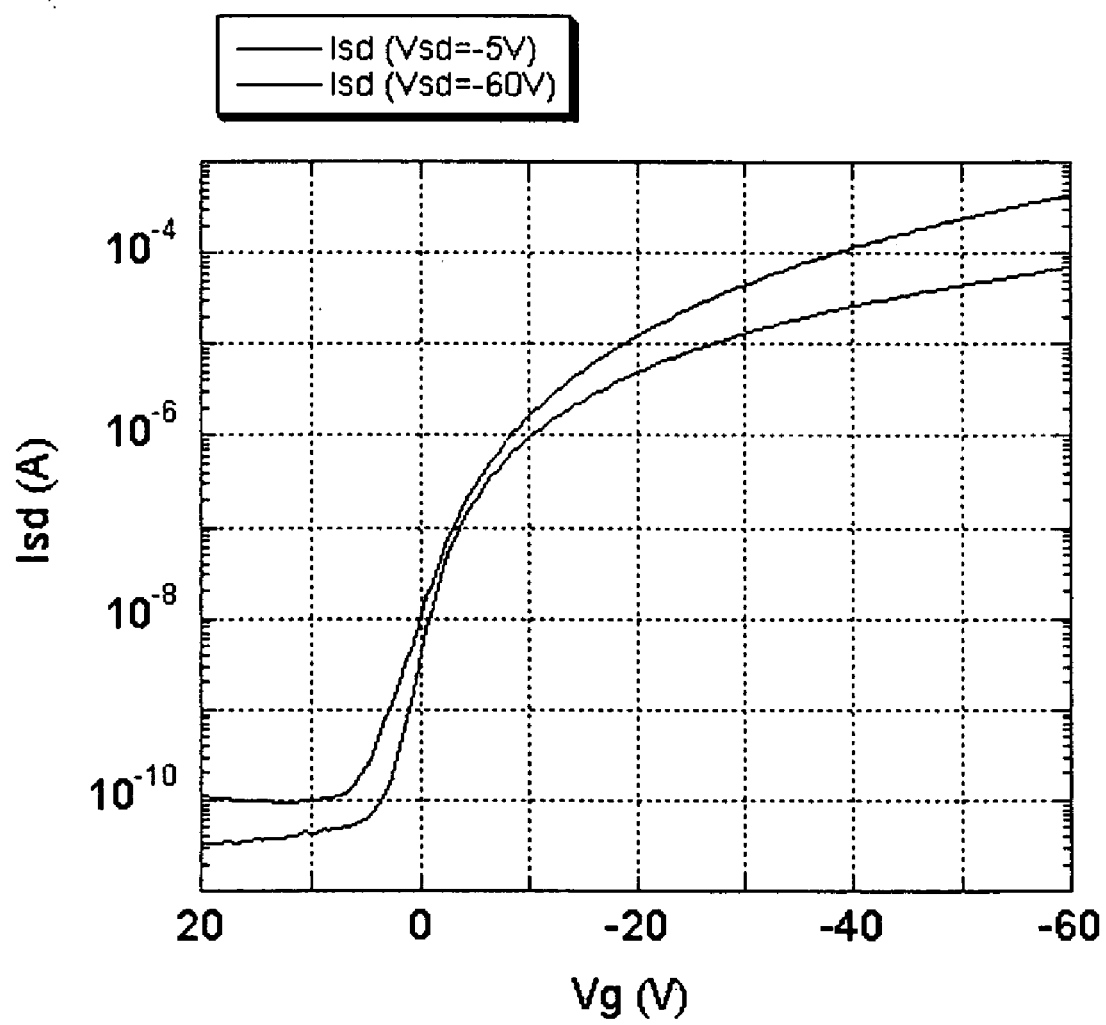
FIG. 1b is a graphical depiction of transfer characteristics of a transistor gate voltage varying between 20 and −60 volts.

FIGS. 1*a* and 1*b* show output (1*a*) and transfer characteristics (1*b*), respectively.

In FIG. 1*a*, the source-drain voltage ($V_{sd}$) is varied between 0 and –60 volts with a different bias voltage applied to the gate electrode ($V_g$). The transistor source-drain current ($I_{sd}$) is plotted versus $V_{sd}$ for $V_g$=0, –15, –30, –45 and –60 V.

In FIG. 1*b* the transistor gate voltage ($V_g$) is varied between 20 and –60 volts for two different setting of source-drain voltage. The $I_{sd}$ is plotted versus $V_g$ for $V_{sd}$=–5 and –60 V respectively.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

What is claimed is:

1. A semiconductor or a charge transport material comprising a compound or a polymer comprising a 3,31'-disubstituted poly-2,2':5',2"-terthiophene unit of formula I

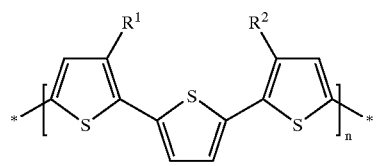

wherein $R^1$ and $R^2$ are, independently of each other, straight chain or branched alkyl, alkoxy, alkenyl, alkylcarbonyl, alkoxycarbonyl, alkylcarbonyloxy, alkylthio, alkylthioalkyl, alkoxyalkyl, alkylsulfinyl or alkylsulfonyl with 1–20 C-atoms, or alkylaryl or arylalkyl comprising an alkyl group with 1–20 C atoms, and n is an integer >1.

2. An optimal, electrooptical, or electronic device comprising a semiconductor or a charge transport material according to claim 1.

3. A semiconductor or a charge transport material according to claim 1, wherein n in formula I is an integer of 2–5000.

4. An optical, electrooptical or electronic device, or a field effect transistor comprising a semiconductor or charge transport material according to claim 3.

5. A semiconductor or a charge transport material according to claim 1, wherein $R^1$ and $R^2$ in formula I are independently, a straight chain alkyl with 1–12 C atoms.

6. A field effect transistor comprising a semiconductor or a charge support material according to claim 1.

7. A thin film transistor or a thin film transistor array for a flat panel display, a radio frequency identification tag, an integrated circuit or an organic light emitting diode comprising a field effect transistor according to claim 6.

8. A security marking or device comprising a field effect transistor according to claim 6.

9. A radio frequency identification tag comprising a field effect transistor according to claim 6.

10. A security marking or device comprising a radio frequency identification tag according to claim 9.

11. An electroluminescent display comprising an electroluminescent layer and/or a charge transport layer, wherein at least one layer comprises a field effect transistor according to claim 6.

12. A liquid crystal display comprising a backlight, wherein the backlight comprises a field effect transistor according to claim 6.

13. A thin film transistor comprising:
a transistor substrate comprising a chemically modified plastic substrate surface; and
a field effect transistor according to claim 6.

14. A thin film transistor comprising:
a pre-patterned insulating substrate; and
a field effect transistor according to claim 6.

15. A field effect transistor comprising:
a gate-dielectric;
a drain electrode;
a source electrode;
a gate electrode;
a substrate; and
a charge transport material according to claim 1.

16. A method of making a thin film transistor, comprising solution processing a semiconductor according to claim 1.

17. A method of forming conducting ionic species comprising oxidatively or reductively doping a semiconductor or a charge transport material according to claim 1.

18. A semiconductor or a charge transport material according to claim 1, further comprising delocalized ionic centers in the material.

* * * * *

UNITED STATES PATENT AND TRADEMARK OFFICE
CERTIFICATE OF CORRECTION

PATENT NO. : 6,953,957 B2
DATED : October 11, 2005
INVENTOR(S) : Iain McCulloch et al.

It is certified that error appears in the above-identified patent and that said Letters Patent is hereby corrected as shown below:

Column 6,
Line 47, reads "3,31'-disubstituted" should read -- 3,3"-disubstituted --.

Signed and Sealed this

Twenty-first Day of February, 2006

JON W. DUDAS
*Director of the United States Patent and Trademark Office*